United States Patent
Koshikawa

(10) Patent No.: US 7,471,586 B2
(45) Date of Patent: Dec. 30, 2008

(54) SEMICONDUCTOR MEMORY DEVICE WHICH CONTROLS REFRESH OF A MEMORY ARRAY IN NORMAL OPERATION

(75) Inventor: Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 72 days.

(21) Appl. No.: 11/736,421

(22) Filed: Apr. 17, 2007

(65) Prior Publication Data

US 2007/0242546 A1 Oct. 18, 2007

(30) Foreign Application Priority Data

Apr. 18, 2006 (JP) ............................. 2006-115021

(51) Int. Cl.
*G11C 7/00* (2006.01)
(52) U.S. Cl. .................. 365/222; 365/236; 365/239
(58) Field of Classification Search ............ 365/222, 365/236, 239
See application file for complete search history.

(56) References Cited

U.S. PATENT DOCUMENTS 6,449,204 B1 * 9/2002 Arimoto et al. ............ 365/222
6,721,223 B2 * 4/2004 Matsumoto et al. ........ 365/222
6,807,121 B2   10/2004 Natsui et al.
6,876,592 B2 * 4/2005 Takahashi et al. ......... 365/222
7,317,650 B2 * 1/2008 Shinozaki et al. .......... 365/222

FOREIGN PATENT DOCUMENTS

JP        2003-187578 A        7/2003

* cited by examiner

*Primary Examiner*—Tuan T. Nguyen
(74) *Attorney, Agent, or Firm*—Sughrue Mion, PLLC

(57) ABSTRACT

A semiconductor memory device is comprised of a refresh counter for sequentially generating a count value indicating one or more row addresses corresponding to one or more word lines to be refreshed when receiving a refresh request at a predetermined interval in normal operation, in which the refresh counter includes n+1 stage counters assigned to n bits included in the row address and a dummy bit not included in the row address, and a counter portion from the least significant bit to the dummy bit forms an N-ary counter, so as to control whether or not refresh is performed in response to a value of the dummy bit when receiving the refresh request.

9 Claims, 13 Drawing Sheets

FIG.3

FIRST EMBODIMENT : CHANGE OF REFRESH OPERATION

| ELAPSED TIME | COUNT VALUE | | | | | ROW ADDRESS TO BE REFRESHED |
|---|---|---|---|---|---|---|
| | CNT13 (dummy) | •• | CNT2 | CNT1 | CNT0 | |
| t0 | 0 | | 0 | 0 | 0 | 0000(h), 2000(h) |
| 2t0 | 0 | | 0 | 0 | 1 | 0001(h), 2001(h) |
| 3t0 | 0 | | 0 | 1 | 0 | 0002(h), 2002(h) |
| ⋮ | ⋮ | | ⋮ | ⋮ | ⋮ | ⋮ |
| 8192t0 | 0 | | 1 | 1 | 1 | 1FFF(h), 3FFF(h) |
| 8193t0 | 1 | | 0 | 0 | 0 | - |
| 8194t0 | 1 | | 0 | 0 | 1 | - |
| ⋮ | ⋮ | | ⋮ | ⋮ | ⋮ | ⋮ |
| 12288t0 | 1 | | 1 | 1 | 1 | - |

COUNTER RESET →

FIG.6

SECOND EMBODIMENT : CHANGE OF REFRESH OPERATION (QUINARY COUNTER)

| ELAPSED TIME | COUNT VALUE (LOWER 4 BITS) | | | | ROW ADDRESS TO BE REFRESHED |
|---|---|---|---|---|---|
| | CNT3 | CNT2 (dummy) | CNT1 | CNT0 | |
| t0 | 0 | 0 | 0 | 0 | 0000(h), 2000(h) |
| 2t0 | 0 | 0 | 0 | 1 | 0001(h), 2001(h) |
| 3t0 | 0 | 0 | 1 | 0 | 0002(h), 2002(h) |
| 4t0 | 0 | 0 | 1 | 1 | 0003(h), 2003(h) |
| 5t0 | 0 | 1 | 0 | 0 | — |
| 6t0 | 1 | 0 | 0 | 0 | 0004(h), 2004(h) |
| 7t0 | 1 | 0 | 0 | 0 | 0005(h), 2005(h) |
| ⋮ | ⋮ | ⋮ | ⋮ | ⋮ | ⋮ |

LOWER 3 BITS RESET → (at 5t0)

SECOND EMBODIMENT : CHANGE OF REFRESH OPERATION (SENARY COUNTER)

| ELAPSED TIME | COUNT VALUE (LOWER 4 BITS) | | | | ROW ADDRESS TO BE REFRESHED |
|---|---|---|---|---|---|
| | CNT3 | CNT2 (dummy) | CNT1 | CNT0 | |
| t0 | 0 | 0 | 0 | 0 | 0000(h), 2000(h) |
| 2t0 | 0 | 0 | 0 | 1 | 0001(h), 2001(h) |
| 3t0 | 0 | 0 | 1 | 0 | 0002(h), 2002(h) |
| 4t0 | 0 | 0 | 1 | 1 | 0003(h), 2003(h) |
| 5t0 | 0 | 1 | 0 | 0 | - |
| 6t0 | 0 | 1 | 0 | 1 | - |
| 7t0 | 1 | 0 | 0 | 0 | 0004(h), 2004(h) |
| 8t0 | 1 | 0 | 0 | 0 | 0005(h), 2005(h) |
| ⋮ | ⋮ | ⋮ | ⋮ | ⋮ | ⋮ |

LOWER 3 BITS RESET → (at 7t0)

FIG.8

SECOND EMBODIMENT : CHANGE OF REFRESH OPERATION (SEPTENARY COUNTER)

| ELAPSED TIME | COUNT VALUE (LOWER 4 BITS) | | | | ROW ADDRESS TO BE REFRESHED |
|---|---|---|---|---|---|
| | CNT3 | CNT2 (dummy) | CNT1 | CNT0 | |
| t0 | 0 | 0 | 0 | 0 | 0000(h), 2000(h) |
| 2t0 | 0 | 0 | 0 | 1 | 0001(h), 2001(h) |
| 3t0 | 0 | 0 | 1 | 0 | 0002(h), 2002(h) |
| 4t0 | 0 | 0 | 1 | 1 | 0003(h), 2003(h) |
| 5t0 | 0 | 1 | 0 | 0 | — |
| 6t0 | 0 | 1 | 0 | 1 | — |
| 7t0 | 0 | 1 | 1 | 0 | — |
| 8t0 | 1 | 0 | 0 | 0 | 0004(h), 2004(h) |
| 9t0 | 1 | 0 | 0 | 0 | 0005(h), 2005(h) |
| ⋮ | ⋮ | ⋮ | ⋮ | ⋮ | ⋮ |

LOWER 3 BITS RESET →

FIG.9

THIRD EMBODIMENT : CHANGE OF REFRESH OPERATION (QUINARY COUNTER)

| ELAPSED TIME | COUNT VALUE (LOWER 4 BITS) | | | | REDUNDANT STATE | ROW ADDRESS TO BE REFRESHED |
|---|---|---|---|---|---|---|
| | CNT3 | CNT2 (dummy) | CNT1 | CNT0 | | |
| t0 | 0 | 0 | 0 | 0 | NON-REDUNDANT | 0000(h) |
| 2t0 | 0 | 0 | 0 | 1 | REDUNDANT | 0001(h), 2001(h) |
| 3t0 | 0 | 0 | 1 | 0 | REDUNDANT | 0002(h), 2002(h) |
| 4t0 | 0 | 0 | 1 | 1 | REDUNDANT | 0003(h), 2003(h) |
| 5t0 | 0 | 1 | 0 | 0 | NON-REDUNDANT | 2000(h) |
| 6t0 | 0 | 0 | 0 | 0 | NON-REDUNDANT | 0004(h) |
| 7t0 | 1 | 0 | 0 | 1 | REDUNDANT | 0005(h), 2005(h) |
| ⋮ | ⋮ | ⋮ | ⋮ | ⋮ | ⋮ | ⋮ |

LOWER 3 BITS RESET → (at 6t0)

FIG.11

THIRD EMBODIMENT : CHANGE OF REFRESH OPERATION (SEPTENARY COUNTER)

| ELAPSED TIME | COUNT VALUE (LOWER 4 BITS) | | | | REDUNDANT STATE | ROW ADDRESS TO BE REFRESHED |
|---|---|---|---|---|---|---|
| | CNT3 | CNT2 (dummy) | CNT1 | CNT0 | | |
| t0 | 0 | 0 | 0 | 0 | NON-REDUNDANT | 0000(h) |
| 2t0 | 0 | 0 | 0 | 1 | NON-REDUNDANT | 0001(h) |
| 3t0 | 0 | 0 | 1 | 0 | NON-REDUNDANT | 0002(h) |
| 4t0 | 0 | 0 | 1 | 1 | REDUNDANT | 0003(h), 2003(h) |
| 5t0 | 0 | 1 | 0 | 0 | NON-REDUNDANT | 2000(h) |
| 6t0 | 0 | 1 | 0 | 1 | NON-REDUNDANT | 2001(h) |
| 7t0 | 0 | 1 | 1 | 0 | NON-REDUNDANT | 2002(h) |
| 8t0 | 1 | 0 | 0 | 0 | NON-REDUNDANT | 0004(h) |
| 9t0 | 1 | 0 | 0 | 1 | NON-REDUNDANT | 0005(h) |
| ⋮ | ⋮ | ⋮ | ⋮ | ⋮ | ⋮ | ⋮ |

LOWER 3 BITS RESET → (at 7t0 → 8t0)

FIG.12A
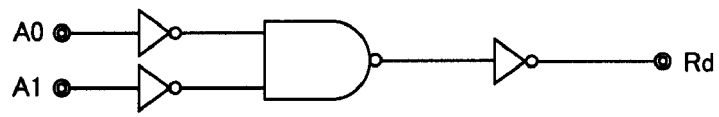
FIG.12B
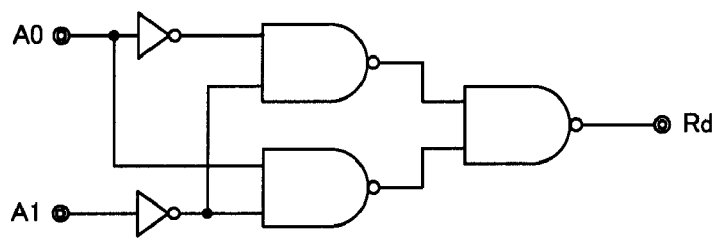
(EQUIVALENT) 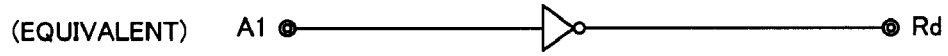
FIG.12C
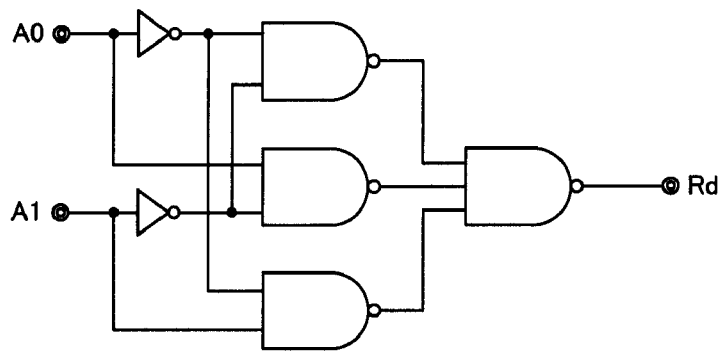
(EQUIVALENT) 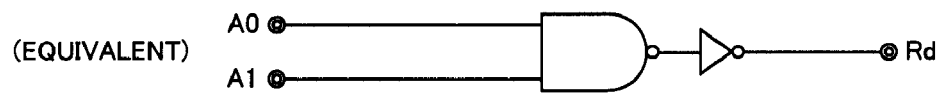

SEMICONDUCTOR MEMORY DEVICE WHICH CONTROLS REFRESH OF A MEMORY ARRAY IN NORMAL OPERATION

BACKGROUND OF THE INVENTION

1. Field of the Invention

The present invention relates to a semiconductor memory device which controls refresh of a memory array in normal operation, and particularly relates to a semiconductor memory device such as a DRAM (Dynamic Random Access Memory) in which when receiving a refresh request at a predetermined refresh interval, one or more word lines selected based on a count value of a refresh counter can be refreshed.

2. Description of the Related Art

Generally, each memory cell of a DRAM should be refreshed at a predetermined refresh period in order to retain data stored as electric charge in the memory cell. In normal operation of an arbitrary bank of the DRAM, a refresh counter counts up a row address at every refresh interval defined in the specification and refresh is sequentially performed for the row address indicated by the count value. For example, on the assumption that $2^m$ word lines corresponding to an m-bit row address are refreshed one by one at every refresh interval, the refresh period of each memory cell is $2^m \cdot t$ (t: refresh interval). However, storage capacity of the DRAM is increased recently, so the refresh period $2^m \cdot t$ is likely to be insufficient for data retention characteristics of the memory cell. Therefore, it is desirable to increase the frequency of refresh so that a refresh period adapted to an actual value of the data retention time of the memory cell is obtained.

To solve such a problem, a configuration in which two or more word lines are refreshed simultaneously at every refresh interval is employed (for example, see JP 2003-187578). For example, by configuring the refresh counter so as to be corresponded to the row address as shown in FIG. 13, two word lines can be refreshed simultaneously. In the example of FIG. 13, the refresh counter including 1-bit counters CNT0 to CNT12 connected in 13 stages is configured. A refresh request signal R is input to the refresh counter, and every time the refresh counter counts up.

The count value of the refresh counter is assigned to lower 13 bits A0 to A12 of the row address. Meanwhile, the most significant bit A13 of the row address is redundant and disconnected from the refresh counter. Thus, the lower 13 bits A0 to A12 are designated by the count value of the refresh counter, and two row addresses corresponding to the most significant bit A13 are selected to be refreshed regardless of whether the bit A13 is 0 or 1. Accordingly, refresh may be performed $2^{13}$ times to complete refresh for all $2^{14}$ word lines which can be designated by the row address, so that the refresh period is reduced to half.

In the above-mentioned conventional configuration of the DRAM, by increasing the number of word lines to be refreshed at every refresh interval from one to two, the refresh period can be reduced to half. However, when reducing the refresh period to half, it is assumed that the refresh period is likely to be too short for the actual value of the data retention time of the memory cell while slightly reduction thereof is sufficient in reality. That is, in the configuration in which one word line is refreshed at every refresh interval, it is insufficient in terms of the data retention characteristics of the memory cell, however in the configuration in which two word lines are refreshed, the frequency of the refresh is likely to be large so that extra current is consumed. If the memory cell has an actual data retention time which corresponds to refresh for about 1.5 word lines at every refresh interval, it is difficult to correspondingly adjust the refresh period, and therefore it is a problem that large current is consumed in refresh operation of the DRAM.

BRIEF SUMMARY OF THE INVENTION

It is an object of the present invention to provide a semiconductor memory device in which the refresh period is finely controlled so as to be adapted to the actual value of the data retention time of each memory cell without restriction of specifications of refresh, and optimum refresh can be realized in consideration of both the data retention characteristics and the consumption current.

An aspect of the present invention is a semiconductor memory device comprising a refresh counter for sequentially generating a count value indicating one or more row addresses corresponding to one or more word lines to be refreshed when receiving a refresh request at a predetermined interval in normal operation, wherein said refresh counter includes n+1 stage counters assigned to n bits included in the row address and a dummy bit not included in the row address, and a counter portion from the least significant bit to said dummy bit forms an N-ary counter, so as to control whether or not refresh is performed in response to a value of said dummy bit when receiving the refresh request.

According to the semiconductor device of the present invention, when the refresh request is received, n bits among the n+1 bit count value are used to designate a row address, and 1 bit is used as the dummy bit. Then, the value of the dummy bit changes in response to operation of the N-ary counter to correspondingly control whether or not refresh is performed, so that a period during which refresh is performed and a period during which refresh is not performed appear alternately. Thus, refresh timing of each word line is controlled in accordance with the position of the dummy bit and setting of N for the N-ary counter so as to finely control the refresh period. Accordingly, the refresh period is adjusted so as to be adapted to the actual value of the data retention time of the memory cell, and it is possible to optimize both the data retention characteristics and the consumption current.

In the semiconductor device of the invention, when receiving the refresh request, refresh may be performed if said dummy bit is 0 and refresh may be not performed if said dummy bit is 1.

In the semiconductor device of the invention, a predetermined bit of the row address may be redundant in refresh operation and two word lines corresponding to row addresses of which said predetermined bit is 0 and 1 may be refreshed when receiving the refresh request.

In the semiconductor device of the invention, each row address may include a group of bits for selecting a block among a plurality of blocks into which an entire memory area is divided, and said predetermined bit being redundant may be included in said group of bits.

In the semiconductor device of the invention, the entire said refresh counter may form an N-ary counter, and the most significant bit of said refresh counter may be assigned to said dummy bit.

In the semiconductor device of the invention, lower m bits of said refresh counter may form an N-ary counter, and the most significant bit of said m bits may be assigned to said dummy bit.

In the semiconductor device of the invention, by determining whether or not a predetermined bit not assigned to said refresh counter is redundant according to a value of the row address when receiving the refresh request, two word lines corresponding to the row addresses of which said predetermined bit is 0 and 1 may be refreshed if said predetermined bit is redundant, and one word line selected from said two word lines in response to said dummy bit may be refreshed if said predetermined bit is not redundant.

Another aspect of the present invention is a semiconductor memory device comprising a refresh counter for sequentially generating a count value indicating one or more row addresses corresponding to one or more word lines to be refreshed when receiving a refresh request at a predetermined interval in normal operation, wherein said refresh counter includes n+1 stage counters assigned to n bits included in the row address and a dummy bit not included in the row address, lower m bits of said refresh counter forms an N-ary counter, and the most significant bit of said m bits is assigned to said dummy bit so as to control whether or not refresh is performed in response to a value of said dummy bit when receiving the refresh request. In this case, N of said N-ary counter may be set so as to satisfy $2^{m-1} < N < 2^m$.

As descried above, according to the present invention, the refresh counter to which the dummy bit is assigned in addition to n bits included in the row address is used and the N-ary counter is configured, so as to control whether or not refresh is performed according to a value of the dummy bit. Therefore, the number of word lines being refreshed is finely controlled at every refresh timing, and the refresh period can be freely adjusted. Accordingly, a semiconductor memory device capable of achieving both the excellent data retention characteristics and the reduction of the consumption current can be realized with a simple configuration.

BRIEF DESCRIPTION OF THE DRAWINGS

The above and other objects and features of the invention will appear more fully hereinafter from a consideration of the following description taken in connection with the accompanying drawing wherein one example is illustrated by way of example, in which;

FIG. 3 is a diagram showing an example of refresh operation of the first embodiment;

FIG. 6 is a diagram showing an operation example corresponding to a case of a quinary counter in the second embodiment;

FIG. 8 is a diagram showing an operation example corresponding to a case of a septenary counter in the second embodiment;

FIG. 9 is a diagram showing an operation example corresponding to a case of a quinary counter in a third embodiment;

FIG. 11 is a diagram showing an operation example corresponding to a case of a septenary counter in the third embodiment;

FIGS. 12A to 12C are diagrams showing specific examples of a redundant control circuit in the third embodiment.

DETAILED DESCRIPTION OF THE INVENTION

Preferred Embodiments of the present invention will be described below with reference to accompanying drawings. Hereinafter, the present invention is applied to a DDR (Double Data Rate)-SDRAM as an example of a semiconductor memory device, which has a total storage capacity of 1G bits and an 8-bank configuration, and three embodiments including refresh counters of different configurations will be described.

First Embodiment

Figure 1:
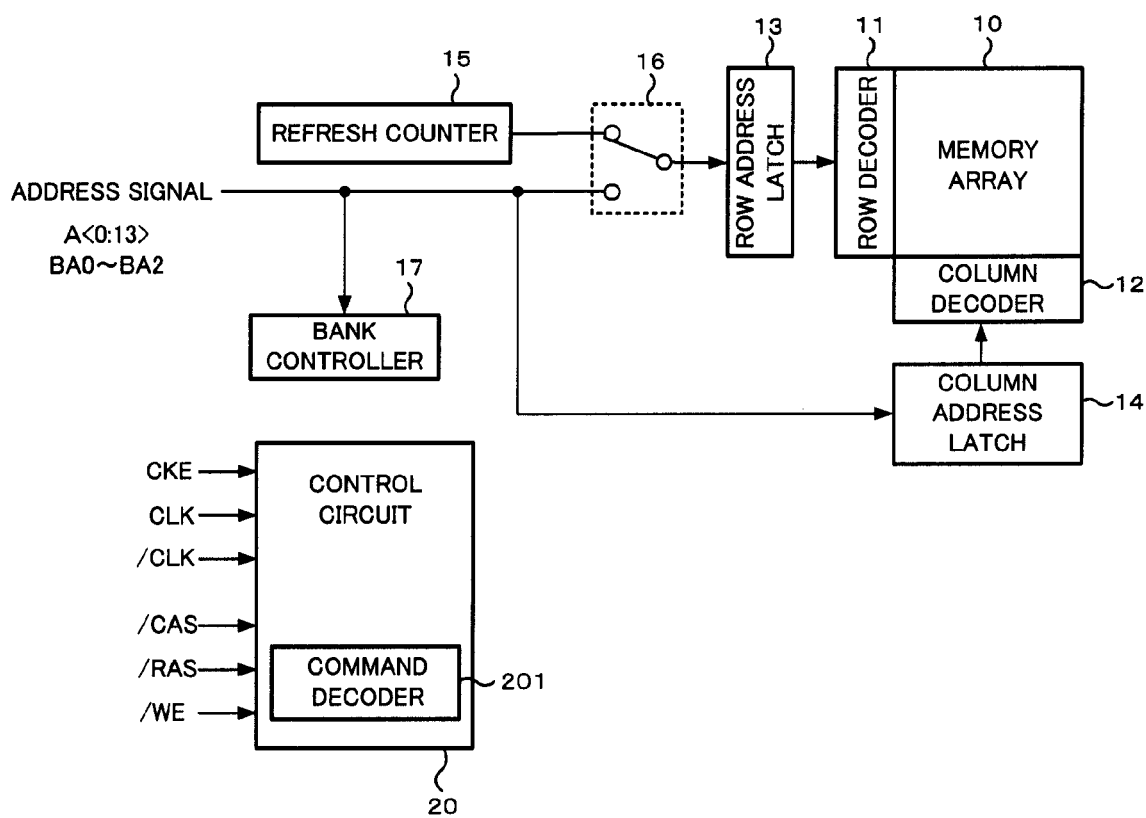
FIG. 1 is a block diagram showing a principal configuration of a DRAM of the first embodiment.

First, a configuration and operation of a DRAM of a first embodiment will be described. FIG. 1 is a block diagram showing a principal configuration of the DRAM of the first embodiment. The DRAM shown in FIG. 1 includes a memory array 10 having a large number of memory cells for storing data. Each memory cell included in the memory array 10 is formed at each intersection of a plurality of word lines and a plurality of bit lines arranged in a matrix form. The entire memory array 10 is divided into a plurality of banks (not shown) having the same size and the same configuration, and read/write operation can be controlled for each bank individually.

In the principal configuration shown in FIG. 1, a row decoder 11, a column decoder 12, a row address latch 13, a column address latch 14, a refresh counter 15, a switch unit 16 and a bank controller 17 are provided in addition to the memory array 10, and a control circuit 20 for controlling operation of these elements is provided.

In the above configuration, the row decoder 11 selects a word line corresponding to a row address stored in the row address latch 13. The column decoder 12 selects a bit line corresponding to a column address stored in the column address latch 14. Thus, an arbitrary memory cell of the memory array 10 is selected to be read or written by the row decoder 11 and the column decoder 12.

When receiving a refresh command, the refresh counter 15 sequentially generates a row address corresponding to a word line selected to be refreshed. The switch unit 16 switches transmission paths of the row address so as to be connected to any of an address signal from the outside or the refresh counter 15. That is, the switch unit 16 is switched to a side of the address signal in read/write operation, and is switched to a side of the refresh counter 15 in refresh operation.

In FIG. 1, an example is shown in which the address signal A<0:13> of 14 bits is input. The address signal A<0:13> is transmitted to the row address latch 13 through the switch unit 16 when a row address is designated, while transmitted to the address latch 14 when a column address is designated. In FIG. 1, an example is shown in which a 3-bit bank selection address BA<0:2> is input from the outside in addition to the address signal A<0:13>. The bank selection address BA<0:2> is sent to the bank controller 17. The bank controller 17 designates a desired bank among eight banks corresponding to 3 bits so that the bank is shifted to an active state.

In normal operation, by switching the switch unit 16 at a predetermined timing, refresh is performed at a predetermined refresh interval, and every time the refresh counter 15 counts up. For example, a refresh command is issued at an interval of 7.8 μs, and at the timing thereof, the selected word line corresponding to a count value of the refresh counter 15 should be refreshed. The refresh counter 15 of the first embodiment is configured to include a 1-bit dummy address in addition to a predetermined number of bits corresponding to the row address, and details thereof will be described later.

The control circuit 20 sends control signals to each part of the DRAM according to an external command so as to control operation thereof. A clock CLK, an inverted clock/CLK, a clock control signal CKE, a /RAS signal, a /CAS signal and a /WE signal are input to the control circuit 20 from the outside. Here, the notation "/" means that the signal goes active when the signal is low level The control circuit 20 includes a command decoder 201, and an external command which is defined by a combination pattern of the input signals is decoded by the command decoder 201.

Figure 2:
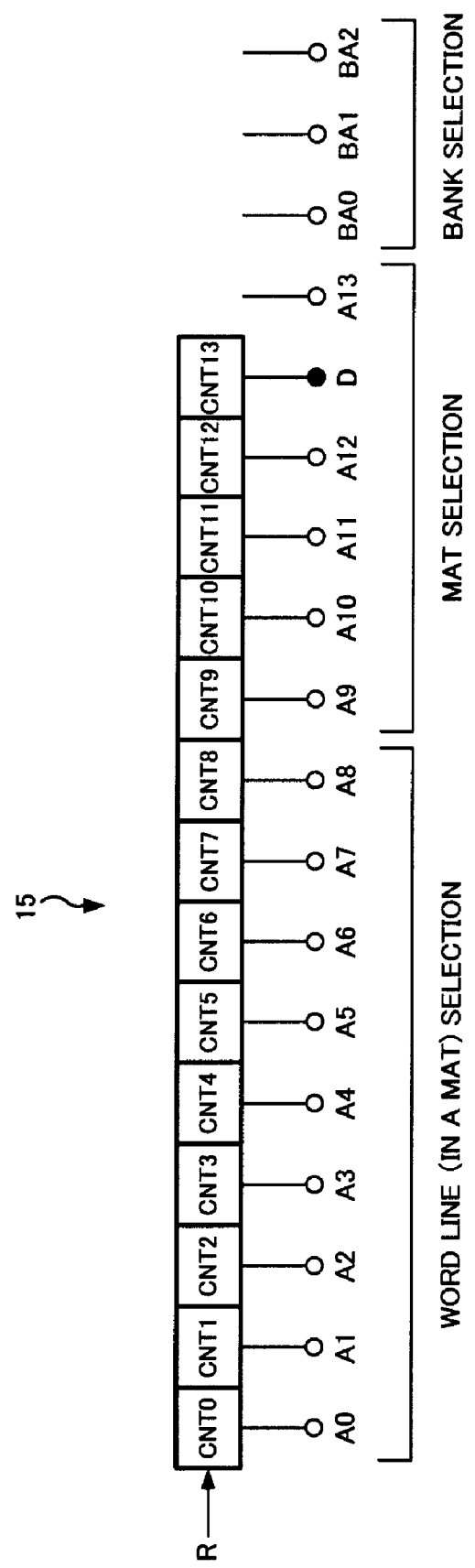
FIG. 2 is a diagram showing a relation between a refresh counter and a row address in the first embodiment.

A relation between the refresh counter 15 and the row address will be described below with reference to FIG. 2. As shown in FIG. 2, the refresh counter 15 of the first embodiment includes 1-bit counters CNT0 to CNT13 connected in 14 stages and outputs a 14-bit count value. Lower 13-bit counters CNT0 to CNT12 of the refresh counter 15 are assigned to lower 13 bits of the row address. Meanwhile, the uppermost counter CNT13 of the refresh counter 15 is assigned to a dummy bit D and disconnected from the row address. The most significant bit A13 of the row address is redundant during refresh, and two row addresses are selected regardless of whether it is 0 or 1. In addition, a refresh request signal R from the control circuit 20 to indicate a timing to perform refresh is supplied to the refresh counter 15.

As shown in FIG. 2, lower 9 bits A0 to A8 among 14 bits A0 to A13 of the row address are assigned to select a word line, and upper 5 bits A9 to A13 are assigned to select a memory mat. Further, 3-bit bank selection address BA0 to BA2 is assigned, as distinguished from the row address. Here, each memory mat is a block into which each bank of the memory array 10 is divided and is used as an access unit commonly having word lines and bit lines. In the example of FIG. 2, 32 memory mats are formed in the memory array 10 in accordance with combinations of 5 bits A9 to A13.

In a single memory mat, 512 word lines which can be designated by the above-mentioned 9 bits A0 to A8 are included. Thus, a single word line in the memory mat can be freely selected in accordance with a combination of lower 9 bits A0 to A8 of the row address. When the single word line is selected by the row decoder 11, a plurality of memory cells on the single word line are activated simultaneously. Since the bit A13 for selecting a memory mat is redundant in the first embodiment, two different memory mats are selected simultaneously, so that two word lines in two memory mats are refreshed simultaneously.

In FIG. 2, the dummy bit D corresponding to the uppermost counter CNT13 of the refresh counter 15 is used as a flag to control whether or not refresh is performed. That is, when the refresh command is issued, if the dummy bit D is 0, the selected word line is refreshed, while if the dummy bit D is 1, the selected word line is not refreshed. Since the refresh counter 15 sequentially counts up from 0, when the uppermost counter CNT13 reaches 1, refresh is not performed at subsequent timings.

Further in FIG. 2, the entire refresh counter 15 composed of the 14-stage counters CNT0 to CNT13 forms an N-ary counter. Thus, the refresh counter 15 counts up at every refresh interval, and is reset when the count value reaches N, so that the count value returns to 0. In this case, when the maximum value of the row address is assumed to be M, refresh is performed in the period that the count value is less than or equal to M, and refresh is not performed in the period that the count value is larger than M and lower than or equal to N. In the example of FIG. 2, M=8192 is satisfied based on the 13 bits corresponding to the refresh counter 15, the value of N is required to be set appropriately in accordance with a desired refresh period described later.

An example of refresh operation of the first embodiment will be described with reference to FIG. 3. In FIG. 3, regarding refresh performed repeatedly at a refresh interval t0 (7.8 μs), a change of count values of the refresh counter 15 starting from 0 is shown. Only values of the counters CNT0 to CNT2 corresponding to the lower 3 bits and the values of the counter CNT13 corresponding to the dummy bit D are shown among the count values of the refresh counter 15 (CNT3 to CNT12 are omitted), and row addresses (hexadecimal) to be refreshed which is designated by the count values are also shown.

As shown in FIG. 3, in every refresh at timing when the refresh interval t0 elapses, the count value of the refresh counter 15 is counted up sequentially from 0. Meanwhile, since the bit A13 of the row address is redundant, two row addresses are sequentially selected to be refreshed at each refresh interval. When the elapsed time is between t0 and 8192t0, the dummy bit D is maintained 0 and refresh is performed for all from 0(h) to 3FFF(h) of the 13 bits A0 to A12 of the row address. Then, at a timing of the subsequent elapsed time 8193t0, the dummy bit D changes to 1, and thereafter refresh is not performed during the dummy bit D is maintained 1.

In the example of FIG. 3, a case is shown in which N=12288 is set for the refresh counter 15 forming the N-ary counter. Thus, the dummy bit D is maintained 1 when the elapsed time is between 8193t0 to 12288t0, and thereafter the count value is reset to be 0. Therefore, the refresh period becomes approximately 95.8 ms relative to the refresh interval t0=7.8 μs. The period during which the dummy bit D is maintained 0 is approximately 63.9 ms, while the period during which the dummy bit D is maintained 1 is approximately 31.9 ms, and thereby a ratio therebetween is 2 to 1.

Figure 13:
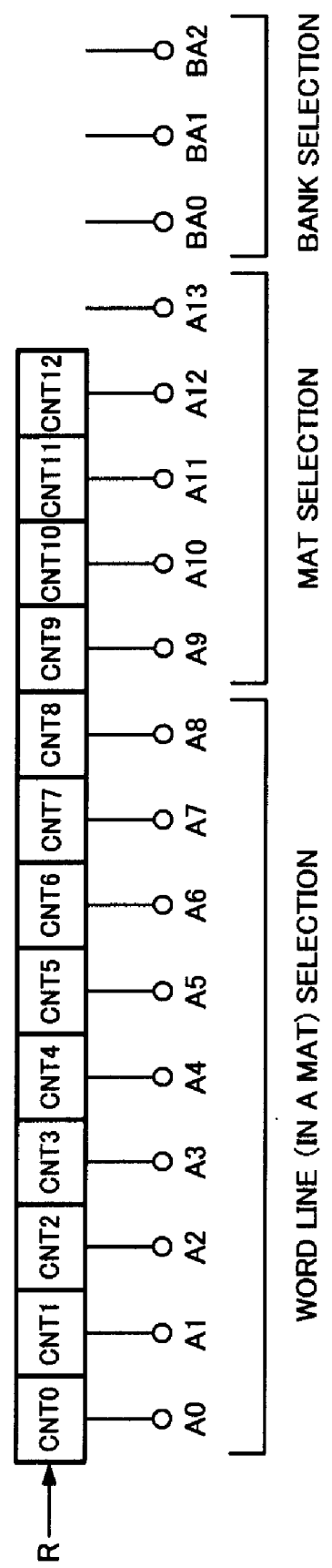
FIG. 13 is a diagram showing a relation between a conventional refresh counter and a row address.

In the conventional configuration (FIG. 13) which does not include the dummy bit D, the refresh period of 63.9 ms is obtained in the same condition. However, in the example of FIG. 3, the refresh period of 95.8 ms is obtained. In this case, the refresh period can be 1.5 times longer than the configuration of FIG. 13. In other words, this means that approximately 1.33 (2÷1.5) word lines on an average per one refresh interval can be refreshed. In this manner, by employing the configuration of the first embodiment, average current consumed in refresh operation can be reduced in comparison with the conventional confirmation (FIG. 13).

In the configuration of the first embodiment, by adjusting N for the refresh counter forming the N-ary counter, the above-mentioned refresh period can be appropriately adjusted. Although, the example of setting N=12288 is shown in FIG. 3 in order to obtain the refresh period which is 1.5 times longer than that in FIG. 13, it is required to set N so as to satisfy N/8192=k in order to obtain the k times longer refresh period.

Figure 4:
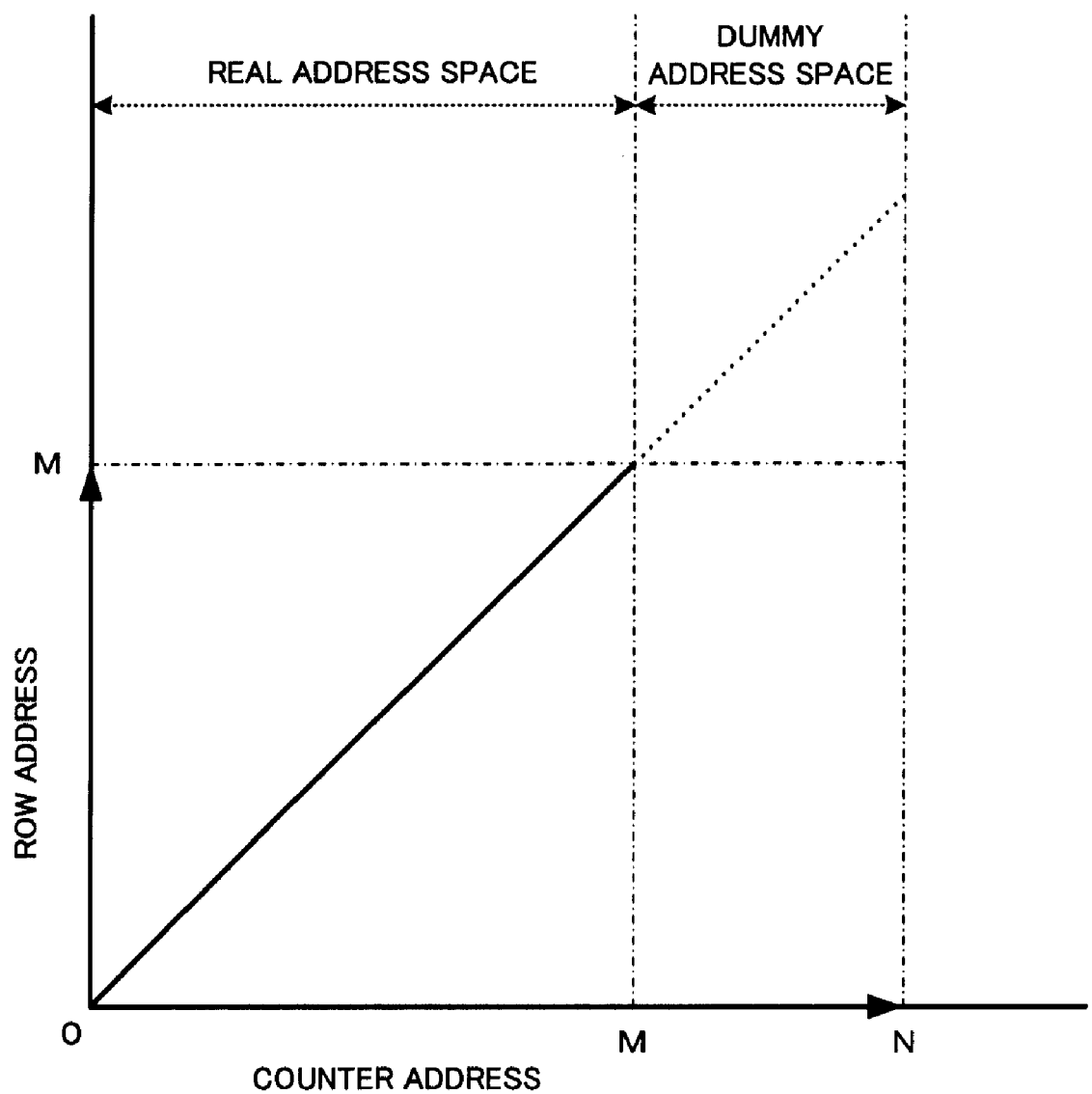
FIG. 4 is a generalized diagram showing a relation between an address space of the refresh counter and the row address in the first embodiment.

Here, FIG. 4 is a generalized diagram showing a relation between an address space of the refresh counter 15 and the row address in the first embodiment. In FIG. 4, the horizontal axis represents counter addresses (count values) of the refresh counter 15 and the vertical axis represents corresponding row addresses. As described above, the maximum value M of the row address and the maximum value N of the counter address are assumed to be set, and M and N are indicated on the vertical and horizontal axes respectively. During one refresh period, the counter address is counted up from 0 to N by the refresh counter 15. It is understood from FIG. 4 that the row address is equal to the counter address in a counter address range from 0 to M. This range is a real address space, in which the dummy bit D is maintained 0 and each row address indicated by the counter address is sequentially selected to be refreshed.

On the contrary, the counter address increases in a counter address range from M to N, but the corresponding row address does not exist therein. This range is a dummy address space, in which the dummy bit D is maintained 1 and the row address is not selected to be refreshed regardless of the counter address. When obtaining the k (k>1) times longer refresh period, the dummy address space which is (k−1) times larger than the real address space may be secured.

By employing the above-mentioned configuration of the first embodiment, the refresh period can be finely adjusted in accordance with data retention characteristics of the memory cell. When employing the conventional configuration, adjustment is made by selectively switching one word line or two word lines to be refreshed at each refresh interval simultaneously, and thus it is difficult to finely adjust the refresh period. In the configuration of the first embodiment, the N-ary counter is formed by setting the dummy bit D at the uppermost position of the refresh counter 15, and thereby N can be set appropriately so as to adjust a refresh period optimum for the data retention characteristics.

Second Embodiment

Figure 5:
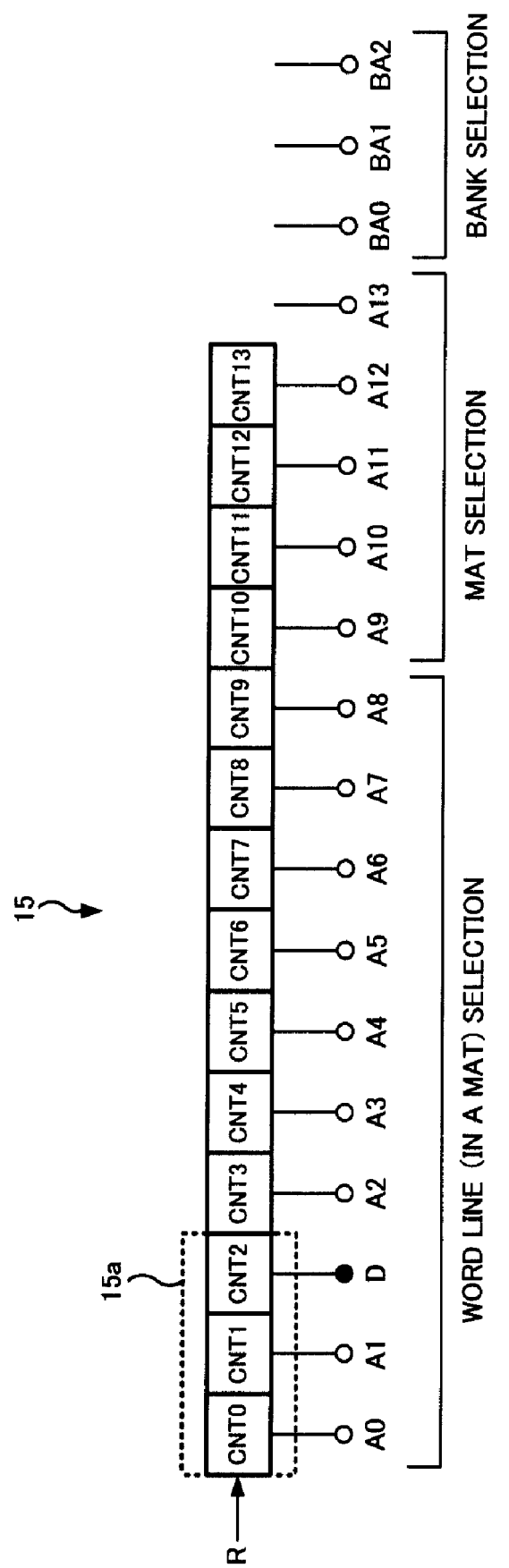
FIG. 5 is a diagram showing a relation between a refresh counter and a row address in a second embodiment.

Next, a configuration and operation of a DRAM of a second embodiment will be described. A principal configuration of the second embodiment is the same as that of the first embodiment, so description thereof will be omitted. Meanwhile, a relation between the refresh counter 15 and the row address in the second embodiment is different from that in the first embodiment, so description thereof will be made with reference to FIG. 5. As shown in FIG. 5, the refresh counter 15 of the second embodiment has the same configuration as the first embodiment in the respect that 1-bit counters CNT0 to CNT13 are connected in 14 stages and a 14-bit count value is output. On the other hand, in the second embodiment, the third stage counter CNT2 of the refresh counter 15 is assigned to the dummy bit D, and the other counters CNT0, CNT1, CNT3 to CNT13 are assigned to lower 13 bits A0 to A12 of the row address. That is, it differs in that the dummy bit D is located at the most significant bit in FIG. 2, while being located at the third lower bit in FIG. 5.

The configuration of the second embodiment as shown in FIG. 5 is basically common to the first embodiment as shown FIG. 2 except the configuration of the refresh counter 15 itself. That is, they have a common configuration in which the significant bit of the row address is redundant so as to select two word lines, or a common configuration in which the refresh request signal R is supplied from the control circuit 20 to the refresh counter 15. Further, a configuration of assignments of 14 bits A0 to A13 of the row address and the bank selection address BA0 to BA2 is also common, and this is assumed to be applied to a DRAM having a common configuration of the memory mats and the bank.

In FIG. 5, lower 3-stage counters CNT0 to CNT2 of the refresh counter 15 forms an N-ary counter 15a. For example, settings of N=5,6,7 and the like can be made. In this case, the dummy bit D corresponding to the uppermost counter CNT2 of the N-ary counter 15a is 0 when the count value of the N-ary counter 15a is less than or equal to 3, and is 1 when the count value of the N-ary counter 15a is larger than or equal to 4. Thus, refresh of the second embodiment is performed when the dummy bit D=0 and is not performed when the dummy bit D=1, as the same as in the first embodiment. Therefore, as the refresh counter 15 counts up, refresh is performed when the count value of the N-ary counter 15a is less than 4, and refresh is not performed when the count value of the N-ary counter 15a is between 4 and N. In this case, one of settings of N=5,6,7 needs to be selectively set according to a required refresh period.

Figure 7:
FIG. 7 is a diagram showing an operation example corresponding to a case of a senary counter in the second embodiment.

An example of refresh operation of the second embodiment will be described with reference to FIGS. 6 to 8. In FIGS. 6 to 8, similarly as the first embodiment, a change of count values of the refresh counter 15 which starts 0 and is counted up repeatedly at the refresh interval t0 is shown, and three cases in which the N-ary counter 15a is set to quinary (FIG. 6), senary (FIG. 7) and septenary (FIG. 8) respectively are compared. In all the cases, two row addresses are selected to be refreshed due to the redundant bit A13, and are sequentially counted up from the first row addresses 0000(h) and 2000(h) by the refresh counter 15.

First, in a case of N=5 shown in FIG. 6, the dummy bit D(counter CNT2) is maintained 0 during the elapsed time from t0 to 4t0. Meanwhile, at the timing when the elapsed time is 5t0, the dummy bit D changes to 1 so as not perform refresh, and at this point the count value is reset by the quinary counter. Thus, at the timing of the subsequent elapsed time 6t0, the dummy bit D returns to 0 so as to perform refresh again. In this manner, four consecutive refresh intervals at which refresh is performed and one refresh interval at which refresh is not performed are repeated.

Further, in a case of N=6 shown in FIG. 7, count values are the same as FIG. 6 during the elapsed time from t0 to 4t0, but the timing when the count value is reset by the senary counter is delayed relative to that in FIG. 5. That is, four consecutive refresh intervals at which refresh is performed and two refresh intervals at which refresh is not performed are repeated. Similarly, in a case of N=7 shown in FIG. 8, count values during the elapsed time from t0 to 4t0 are the same as FIGS. 6 and 7, but the timing when the count value is reset by the septenary counter is further delayed. That is, four consecutive refresh intervals at which refresh is performed and three refresh intervals at which refresh is not performed are repeated.

Accordingly, the number of refresh intervals necessary to refresh eight word lines is increased in proportion to N such as 5,6,7, and these ratios are maintained the same if the number of word lines are increased. Therefore, the refresh period in comparison with FIG. 13 becomes 1.25 times longer in the case of N=5, becomes 1.5 times longer in the case of N=6, and becomes 1.75 times longer in the case of N=7. In other words, the number of word lines on an average per one refresh interval is 1.65 in the case of N=5, is approximately 1.33 in the case of N=6, is approximately 1.14 in the case of N=7, and is gradually reduced. In this manner, by setting appropriate N for the N-ary counter 15a, the refresh period can be adjusted to an appropriate value between 1 and 2.

When comparing the second embodiment with the first embodiment, a period during which refresh is performed and a period during which refresh is not performed are both shorter in the refresh period. That is, in the case of FIG. 3, the period of during which refresh is performed between the elapsed time of t0 and 8191t0, and the period during which refresh is not performed between the elapsed time of 8192t0 and 12288t0 are repeated. On the contrary, in FIG. 7 in which condition of the refresh period is the same, it is understood that four refresh intervals at which refresh is performed and two refresh intervals at which refresh is not performed are frequently repeated. Accordingly, in the second embodiment, the period during which the peak of the average current fluctuates can be shortened.

Third Embodiment

Next, a configuration and operation of a DRAM of a third embodiment will be described. A principal configuration and a relation between the refresh counter 15 and the row address are the same as those of the second embodiment. In the third embodiment, the assigned row address is used similarly as the second embodiment, but it is a feature that control is performed such that the most significant bit A13 of the row address is switched between redundant and non-redundant states in refresh operation.

Figure 10:
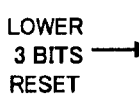
FIG. 10 is a diagram showing an operation example corresponding to a case of a senary counter in the third embodiment.

An example of refresh operation of the third embodiment will be described with reference to FIGS. 9 to 11 corresponding to FIGS. 6 to 8 of the second embodiment. In FIGS. 9 to 11, the refresh counter 15 operates in the same condition as FIGS. 6 to 9, and cases in which the N-ary counter 15a is set to quinary (FIG. 9), senary (FIG. 10) and septenary (FIG. 11) respectively are compared.

First, in a case of N=5 shown in FIG. 9, the bit A13 becomes non-redundant when counters CNT0 and CNT1 are both 0 at the timing of the elapse time t0 so as to select only one row address 0000(h). Then, the bit A13 does not become non-redundant (redundant state) during the elapse time from 2t0 to 4t0 so as to select two row addresses similarly as in FIG. 6. Further, the bit A13 becomes non-redundant again when counters CNT0 and CNT1 are both 0 at the timing of the elapse time 5t0 so as to select only one row address 2000(h).

In this manner, as shown in FIG. 9, control is performed such that the bit A13 is in the non-redundant state under the condition in which lower 2 bits of the refresh counter 15 (CNT0,CNT1) are both 0, and is in the redundant state under the other conditions. Then, in the case of the bit A13 is in the non-redundant state, the selected row address is determined according to the dummy bit D. That is, when the dummy bit D is 0, a row address corresponding to A13=0 is selected, while when the dummy bit D is 1, a row address corresponding to A13=1 is selected. In this case, it is different from the first and second embodiments, in that refresh is performed even if the dummy bit is 1.

In cases of N=6 shown in FIG. 10 and N=7 shown in FIG. 11, substantially the same control is performed, but respective conditions for the bit A13 to become non-redundant are different. First, in the case of FIG. 10, the bit A13 becomes non-redundant in the condition of CNT0=1 and CNT1=0 in addition to the condition of CNT0=0 and CNT1=0. Meanwhile, in the case of FIG. 11, the bit A13 becomes non-redundant, in the condition of CNT0=0 and CNT1=0, in the condition of CNT0=1 and CNT0=0, and in the condition of CNT0=0 and CNT1=1. It is common that one row address is selected according to the dummy bit D when the bit A13 becomes non-redundant.

FIGS. 12A to 12C show specific examples of a redundant control circuit for generating a control signal Rd to control the redundant state of the bit A13 in refresh operation. FIG. 12A corresponding to FIG. 9 (quinary), FIG. 12B corresponding to FIG. 10 (senary) and FIG. 12C corresponding to FIG. 11 (septenary) are shown respectively. In each redundant control circuit of FIGS. 12A to 12C, lower 2 bits A0 and A1 of the row address are input and the control signal Rd is output, and thereby the redundant state is set when Rd=1 while the non-redundant is set when Rd=0.

FIG. 12A shows an example of the redundant control circuit corresponding to N=5 (quinary), in which three inverters, one inverter and one NOR gate are included so that Rd=0 is output when A0=A1=0 and Rd=1 is output otherwise. FIG. 12B shows an example of the redundant control circuit corresponding to N=6 (senary), in which two inverters and three NOR gates are included so that Rd=0 is output when (A0=A1=0) or (A0=1, A1=0) and Rd=1 is output otherwise. FIG. 12C shows an example of the redundant control circuit corresponding to N=7 (septenary), in which two inverters and four NOR gates are included so that Rd=1 is output when (A0=A1=1) and Rd=0 is output otherwise. In addition, regarding FIGS. 12B and 12C, equivalent circuits to the respective redundant control circuit are shown.

As described above, as a result of control of the redundant state of the bit A13, either one or two word lines are selected at each refresh interval in refresh operation in accordance with a predetermined pattern. In this case, the number of selected word lines on an average per one refresh interval in FIG. 9 toll is the same as that in FIGS. 6 to 8 of the second embodiment respectively. Meanwhile, in the second embodiment, since the number of selected word lines is 0 or 2, fluctuation of the number of selected word lines with the lapse of time is smaller in the third embodiment. Therefore, in the third embodiment, time fluctuation of the peak current depending on the selected word lines can be controlled to be small.

Although the present invention have been specifically described above based on the embodiments, the present invention is not limited to the embodiments described above, and the various changes and modification can be made without departing from the sprit and scope of the present invention. For example, the case in which the dummy bit D is assigned to the most significant bit of the refresh counter 15 in the first embodiment, and the case in which the dummy bit D is assigned to the third lowest bit of the refresh counter 15 in the second embodiment are described respectively. However, the position of the dummy bit D in the refresh counter 15 can be freely adjusted, and an appropriate bit position in the row address can be set according to the number of bits of the row address and the configuration of the N-ary counter.

Further, in the first and second embodiment, the case in which refresh is performed when the dummy bit D is 0 and refresh is not performed when the dummy bit D is 1. However, on the contrary, control may be performed such that refresh is performed when the dummy bit D is 1 and refresh is not performed when the dummy bit D is 0.

The present invention is not limited to the above described embodiments, and various variations and modifications may be possible without departing from the scope of the present invention.

This application is based on the Japanese Patent application No. 2006-115021 filed on Apr. 18, 2006, entire content of which is expressly incorporated by reference herein.

What is claimed is:

1. A semiconductor memory device comprising a refresh counter for sequentially generating a count value indicating one or more row addresses corresponding to one or more word lines to be refreshed when receiving a refresh request at a predetermined interval in normal operation,
wherein said refresh counter includes n+1 stage counters assigned to n bits included in the row address and a dummy bit not included in the row address, and a counter portion from the least significant bit to said dummy bit forms an N-ary counter, so as to control whether or not refresh is performed in response to a value of said dummy bit when receiving the refresh request.

2. A semiconductor memory device according to claim 1, wherein when receiving the refresh request, refresh is performed if said dummy bit is 0 and refresh is not performed if said dummy bit is 1.

3. A semiconductor memory device according to claim 1, wherein a predetermined bit of the row address is redundant in refresh operation and two word lines corresponding to row addresses of which said predetermined bit is 0 and 1 are to be refreshed when receiving the refresh request.

4. A semiconductor memory device according to claim 3, wherein each row address includes a group of bits for selecting a block among a plurality of blocks into which an entire memory area is divided, and said predetermined bit being redundant is included in said group of bits.

5. A semiconductor memory device according to claim 1, wherein the entire said refresh counter forms an N-ary counter, and the most significant bit of said refresh counter is assigned to said dummy bit.

6. A semiconductor memory device according to claim 1, wherein lower m bits of said refresh counter forms an N-ary counter, and the most significant bit of said m bits is assigned to said dummy bit.

7. A semiconductor memory device according to claim 1, wherein by determining whether or not a predetermined bit not assigned to said refresh counter is redundant according to a value of the row address when receiving the refresh request, two word lines corresponding to the row addresses of which said predetermined bit is 0 and 1 are to be refreshed if said predetermined bit is redundant, and one word line selected from said two word lines in response to said dummy bit is to be refreshed if said predetermined bit is not redundant.

8. A semiconductor memory device according to claim 7, wherein N of said N-ary counter is set so as to satisfy $2^{m-1}<N<2^m$.

9. A semiconductor memory device comprising a refresh counter for sequentially generating a count value indicating one or more row addresses corresponding to one or more word lines to be refreshed when receiving a refresh request at a predetermined interval in normal operation,
wherein said refresh counter includes n+1 stage counters assigned to n bits included in the row address and a dummy bit not included in the row address, lower m bits of said refresh counter forms an N-ary counter, and the most significant bit of said m bits is assigned to said dummy bit so as to control whether or not refresh is performed in response to a value of said dummy bit when receiving the refresh request.

* * * * *